United States Patent [19]

Ruckert

[11] Patent Number: 4,983,501

[45] Date of Patent: Jan. 8, 1991

[54] POSITIVE-WORKING RADIATION-SENSITIVE COMPOSITION AND RADIATION-SENSITIVE RECORDING MATERIAL PREPARED THEREWITH

[75] Inventor: Hans Ruckert, Wiesbaden-Naurod, Fed. Rep. of Germany

[73] Assignee: Hoechst Aktiengesellschaft, Frankfurt am Main, Fed. Rep. of Germany

[21] Appl. No.: 388,817

[22] Filed: Aug. 3, 1989

[30] Foreign Application Priority Data

Aug. 17, 1988 [DE] Fed. Rep. of Germany ....... 3827901

[51] Int. Cl.$^5$ .................................................. G03C 5/00
[52] U.S. Cl. ................................... 430/326; 430/270; 430/171; 430/286; 430/293
[58] Field of Search ............... 430/270, 325, 281, 286, 430/192, 170

[56] References Cited

U.S. PATENT DOCUMENTS

| | | |
|---|---|---|
| 3,515,552 | 6/1970 | Smith ..................................... 96/35.1 |
| 3,779,778 | 12/1973 | Smith et al. ........................ 96/115 R |
| 4,101,323 | 7/1978 | Buhr et al. .............................. 96/35 |
| 4,189,323 | 2/1980 | Buhr ..................................... 430/281 |
| 4,247,611 | 1/1981 | Sander et al. ......................... 430/286 |
| 4,250,247 | 2/1981 | Sander et al. ......................... 430/270 |
| 4,311,782 | 1/1982 | Buhr et al. ............................ 430/270 |
| 4,506,003 | 3/1985 | Ruckert et al. ....................... 430/270 |
| 4,506,006 | 3/1985 | Ruckert ................................. 430/325 |
| 4,789,619 | 12/1988 | Ruckert et al. ....................... 430/270 |
| 4,840,867 | 6/1989 | Elsaesser et al. ..................... 430/270 |

FOREIGN PATENT DOCUMENTS 3725741 2/1989 Fed. Rep. of Germany .
1154749 6/1969 United Kingdom .

OTHER PUBLICATIONS

Methoden Der Organischen Chemie (Houben–Weyl), 6/1d, p. 136.
The Journal of Organic Chemistry, vol. 25, Jan.–Jun. 1960, p. 258.
The Journal of the Chemical Society, Part II, p. 597.

*Primary Examiner*—Paul R. Michl
*Assistant Examiner*—John S. Y. Chu
*Attorney, Agent, or Firm*—Foley & Lardner, Schwartz, Jeffery, Schwaab, Mack, Blumenthal & Evans

[57] ABSTRACT

A positive-working radiation-sensitive composition is described, which comprises a binder which is insoluble in water and soluble or swellable in organic solvents and in aqueous-alkaline solutions, a compound which forms a strong acid upon irradiation, and a compound of the general formula

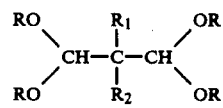

wherein R denotes an alkyl group which may be substituted and
$R_1$ and $R_2$ are identical or different and denote alkyl groups containing 1 to 6 carbon atoms.

The composition is suitable for use in the production of radiation-sensitive recording materials such as printing plates or photoresists and is characterized by increased flexibility and good overdevelopment resistance.

11 Claims, No Drawings

POSITIVE-WORKING RADIATION-SENSITIVE COMPOSITION AND RADIATION-SENSITIVE RECORDING MATERIAL PREPARED THEREWITH

BACKGROUND OF THE INVENTION

The invention relates to a positive-working radiation-sensitive composition. More particularly, the invention relates to a composition which is rendered soluble by irradiation, which comprises:

(a) a compound which forms a strong acid upon irradiation,
(b) a compound having at least one acid-cleavable C—O—C bond, such as an acetal, and
(c) a binder which is insoluble in water and soluble or swellable in organic solvents and in aqueous-alkaline solutions, and which is suitable for use in the production of radiation-sensitive recording materials such as photoresists, electronic components and printing plates and for chemical milling. Compositions containing the above-indicated components are described, for example, in U.S. Pat. No. 3,779,778, DE-A No. 27 18 254 (corresponding to U.S. Pat. No. 4,247,611), DE-A No. 29 28 636 (corresponding to U.S. Pat. No. 4,311,782), EP-A No. 0 006 626 (corresponding to U.S. Pat. No. 4,250,247) and in EP-A No. 0 042 562 (corresponding to U.S. Pat. No. 4,506,003).

Upon exposure of these materials, photolysis of compound (a) leads to the formation of acid which causes the cleavage of C—O—C bonds of compound (b) such that, as a result, the exposed areas of the light-sensitive layers are rendered soluble in the developer. These mixtures of substances are, however, not free from disadvantages.

The hitherto used polyacetals and polyorthoesters are in some cases not readily accessible and/or have the property of being obtained in various molecular weight distributions, depending on the conditions of condensation. This has an influence on both the production cost and the desired copying characteristics, in particular the constancy of light sensitivity of light-sensitive layers prepared from these compounds. The known light-sensitive compositions cannot contain more than a certain amount of acid-cleavable compounds; their main constituent comprises, as a rule, a binder which is insoluble in water and soluble in aqueous alkali, which gives the compositions an adequate overdevelopment resistance. However, this large amount of alkali-soluble binder, preferably phenolic resin, has the effect that layers formed from these compositions, in particular layers of relatively great thicknesses, are relatively brittle and tend to crack or splinter.

Up to now, it has been the prevailing opinion that for good imagewise differentiation the greatest possible number of cleavable C—O—C bonds, i.e. polymeric compounds, must be present, the C—O—C bonds being preferably in the main chain of the polymer, so that many small fragments which are considerably more soluble are formed from one polymer molecule.

DE-A No. 37 25 741 describes a radiation-sensitive composition which can contain as the acetal, inter alia, a compound of the general formula

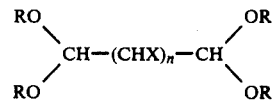

It has now been found that, based on further available, industrially produced intermediate products, novel substituted malonaldehyde tetraacetals can be prepared, which are also well suitable for use in positive-working light-sensitive layers.

SUMMARY OF THE INVENTION

Accordingly, it is an object of the present invention to provide a radiation-sensitive composition based on an acid-cleavable compound having a high radiation sensitivity, which has a good overdevelopment resistance and yields copying layers of improved flexibility.

In accomplishing the foregoing and other objectives, there has been provided, in accordance with one aspect of the present invention, a positive-working radiation-sensitive composition comprising a binder which is insoluble in water and soluble or swellable in organic solvents and in aqueous-alkaline solutions, a compound which forms a strong acid upon irradiation, and an acetal compound of the general formula

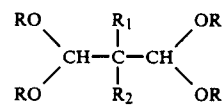

wherein

R denotes an alkyl group which may be substituted, and $R_1$ and $R_2$ are identical or different and denote alkyl groups containing 1 to 6 carbon atoms.

In accordance with another aspect of the present invention there is provided a process for the production of relief images, in which a radiation-sensitive recording material comprising a support and a radiation-sensitive recording layer which comprises the above-described radiation-sensitive composition is irradiated imagewise using actinic radiation in a dose such that the solubility of the layer in a liquid developer increases, and the irradiated areas of the layer are washed out using an aqueous-alkaline developer.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

Preferably, R denotes an alkyl group substituted by alkoxyl, aryl, aryloxyl or polyalkoxyl and containing, in each case, a total of 2 to 20, in particular 2 to 10 carbon atoms and $R_1$ and $R_2$ denote identical or different alkyl groups containing 1 to 4 carbon atoms.

In the context of this description, actinic radiation is meant to denote any radiation, the energy of which corresponds at least to that of short-wave visible light. Particularly suitable are short-wave to long-wave UV radiation, also in the form of laser radiation, but also electron radiation and X-rays.

Liquid developers are taken to mean, in particular, weakly alkaline aqueous solutions which may be mixed with organic solvents.

The tetraacetals of the general formula I are derived from dialkyl-substituted malonaldehydes and monoalcohols, preferably primary alcohols. Suitable alcohols ROH are those in which R has the following meaning: alkyl, alkoxyalkyl, arylalkyl, aryloxyalkyl and polyalkoxyalkyl. Examples of suitable alcohols are 2-ethyl butanol, 2-n-butoxy ethanol, benzyl alcohol, 2-phenoxy ethanol and 2-(2-n-butoxy ethoxy)ethanol.

The compounds of the general formula claimed are new, with the exception of those cases, in which $R_1$ and $R_2$ denote methyl and R denotes ethyl [J. org. Chem. 25; 258 (1960)].

The tetramethylacetals ($R=CH_3$) which served as starting products for the transacetalizations with elimination of methanol were prepared analogously.

The cleavable tetraacetals according to the invention can be prepared by transacetalization of the corresponding tetramethyl, tetraethyl or mixed methyl-ethyl acetals, preferably the tetramethylacetals, with commercially available alcohols, methanol and/or ethanol being distilled off.

These tetramethylacetals of dialkylmalonaldehydes (3) are prepared from commercially available aliphatic monoaldehydes or their dimethylacetals (1), some of which are also already commercially available, according to the following reaction sequence:

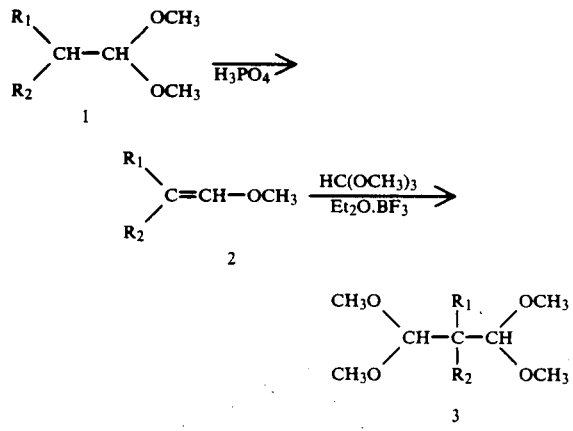

If the dimethyl acetals (1) are not commercially available they are prepared from aldehyde and methanol or methyl orthoformate, according to known methods or instructions and are purified by distillation.

Cleavable products (3) according to the present invention are prepared starting from aldehydes such as isobutyraldehyde dimethylacetal ($R_1$ and $R_2$=methyl), 2-methylbutyraldehyde dimethylacetal ($R_1$=methyl, $R_2$=ethyl), 2-ethylbutyraldehyde dimethylacetal ($R_1$ and $R_2$=ethyl) and 2-ethylhexanal dimethylacetal ($R_1$=ethyl and $R_2$=butyl). Isobutyraldehyde diethylacetal could be prepared according to the instruction given in J. Chem. Soc. 1945, 597 (index of refraction $n=1.394$).

The synthesis of the enol ethers (2) from (1) is carried out analogously to the method described in J. org. Chem. 25; 258 (1960), by elimination of methanol with 85% strength phosphoric acid as a catalyst and fractional distillation. Using a good column it is possible to separate first the methanol under normal pressure and then, in vacuo, the enol ethers. In some cases, a purifying distillation was omitted since, in the reaction of the enol ethers (2) to form the dialkylmalonaldehyde tetraacetals (3) fractional distillation was repeated, in any case, until the starting products had been removed (cf. Houben Weyl 6/1 d, p. 136).

The addition of orthoesters to enol ethers (2) to give the methyl (or ethyl) acetals (3) is also satisfactorily carried out with boron trifluoride etherate, according to the same instructions from the literature.

All syntheses, with the exception of neutralizing and drying the desired fractions, were only run by fractional distillation. In repetitions, the total yield can be improved by reusing non-reacted enol ether or orthoester fractions removed by distillation. In the derivatives substituted by higher alkyl groups, fractionation in the last stage (3) was performed in an oil-pump vacuum and the residue was not further purified. Transacetalization of these crude higher substituted products, for example, ethylbutylmalonaldehyde tetramethylacetal, for example, with 2-ethoxyethanol and with elimination of methanol, leads to substances according to the invention, which are still less distillable. The fact that these substances can advantageously be employed in positive layers also proves the successful course of the syntheses.

The starting products for the novel cleavable tetraacetals employed in positive layers were characterized by gas-chromatographic controls and infrared spectra and also by their boiling ranges (Kp) and refraction indices ($n_D$), which are indicated in the table below.

TABLE

| $R_1$ | $R_2$ | Aldehyde diacetal 1 | Enol ether 2 | Dialkylmalonaldehyde tetraacetal 3 |
|---|---|---|---|---|
| $CH_3$ | $CH_3$ | $R_1R_2CH-CH(OC_2H_5)_2$ | $R_1R_2C=CH-OC_2H_5$ | $(C_2H_5O)_2CH-C(R_1)(R_2)-CH(OC_2H_5)_2$ |
| | | Kp 134–135° C., $n_D = 1.394$ | Kp 92–94° C., $n_D = 1.406$ | $Kp_{0.2} = 48$–56° C., $n_D = 1.418$ |
| $CH_3$ | $CH_3$ | $R_1R_2CH-CH(OCH_3)_2$ | $R_1R_2C=CH-OCH_3$ | $(CH_3O)_2CH-C(R_1)(R_2)-CH(OCH_3)_2$ |

TABLE-continued

| $R_1$ | $R_2$ | Aldehyde diacetal 1 | Enol ether 2 | Dialkylmalonaldehyde tetraacetal 3 |
|---|---|---|---|---|
| | | Kp 83° C., $n_D$ = 1.388 | Kp~99° C., $n_D$ = 1.392 | Kp~35 94–98° C., $n_D$ = 1.419 ($C_{calc.}$ 56.2% found ~56% $H_{calc.}$ 10.4% found 10–11%) |
| $CH_3$ | $C_2H_5$ | Kp 130° C., $n_D$ = 1.398 | Kp 103° C., $n_D$ = 1.411 IR 1670 cm$^{-1}$ vinyl proton | $n_D$ = 1.4255 |
| $C_2H_5$ | $C_2H_5$ | Kp~150° C., $n_D$ = 1.408 Kp$_{100}$~88° C. | Kp ~120–128° $n_D$ = 1.421 | $n_D$ = 1.429 |
| $C_2H_5$ | $nC_4H_9$ | Kp$_{20}$~80° C., $n_D$ = 1.418 | Kp 173–182° C., $n_D$ = 1.423 | $n_D$ = 1.432 |

The compounds according to the present invention were formed upon heating of the tetramethyl or tetraethyl acetals with a slight excess of alcohol in the presence of an acid catalyst, such as toluenesulfonic acid or advantageously in the presence of a montmorillonite ion exchanger, for example K 10 from Suedchemie, which can be filtered off when the transacetalization is complete, methanol being distilled off continuously. Towards the end of the transacetalization, the methanol which remains, and then, in vacuo, the distillable excess of the starting components, are removed, expediently using a fractionating column. Only the substances containing lower groups R, $R_1$ and $R_2$ can be distilled in an oil-pump vacuum, which is an unsatisfactory method. The substances are therefore used in the layers in the undistilled state and are thus compared under similar conditions.

In both cases, i.e. when using tetramethyl and tetraethyl acetal, each transacetalated with 2-ethoxyethanol, in which, after distilling off methanol and/or ethanol, a colorless end product was obtained in a molecular distillation at about 0.2 torr, an application-related examination showed that there was no significant difference between the colorless distillate and the crude product obtained after distilling off the methanol and the starting components.

Furthermore, it has been shown that the optimum proportion of cleavable substance in the light-sensitive composition according to the invention, and thus the achievable differentiation between the exposed and nonexposed areas of the layer, is considerably dependent on the alcohol component used, in particular its size and hydrophilic character, and on the interaction with the binder.

The structure of the aldehyde component has an analogous influence. The non-polarity of the products increases with increasing size of the alkyl substituents $R_1$ and $R_2$, in each case related to tetraacetals having the same alcohol component. In an application test this has the effect that the layers show a softer consistency and take a longer time to develop completely, but it is also possible to use a comparatively higher amount of acetal, relative to total solids. Due to the fact that the tetraacetals according to the invention permit many variants, both in view of the alkyl substitution of the malonaldehyde and the selection of the alcohol component, a great choice of useful cleavable compounds is available.

The ideal proportion of acetal in the composition according to the invention is about 25 to 60 percent by weight, preferably 30 to 40 percent by weight, relative to total solids, as against approximately 15 to 25 percent by weight contained in the oligomeric and polymeric cleavable compounds known in the art. Compared with the tetraacetals disclosed in DE-A No. 37 25 741 mentioned above, similar proportions—in the case of $R_1$, $R_2$ denoting alkyl with more than 4 carbon atoms even higher proportions—have the most favorable influence on the overall characteristics, i.e. mechanical properties, light sensitivity, developability in dilute alkali, resistance to overdevelopment and etching and electroplating conditions.

The cleavable compounds according to the present invention can be employed individually, mixed with one another and also in combination with known acid-cleavable compounds. It is also possible to replace up to about 30% of the alcohol component by diols in the transacetalization. Besides monomeric acetals, oligomeric to polymeric acetals of the dialdehydes employed are also produced here, which results in higher viscosity of the products. Diol contents of greater than about 50% result in crosslinked polyacetals and thus in gelling and development problems.

For the production of the positive-working radiation-sensitive compositions according to the invention, the acetals described are mixed with substances which form acids photochemically and/or through the action of high-energy radiation, particularly electron radiation or X-rays.

The compositions furthermore comprise a polymeric binder which is insoluble in water, but soluble in organic solvents. Since aqueous-alkaline solutions can advantageously be employed as developer liquids for the exposed copying layers and since these are generally preferred over developers based on organic solvents, binders are used which are soluble or at least swellable in aqueous alkalis.

The type and quantity of the water-insoluble binders can vary depending on the purpose of use; proportions of the total solids content of between about 30 and 80, particularly preferably 50–75, percent by weight are preferred.

The phenolic resins, above all novolaks, which have proven successful in many positive copying materials have also proven particularly advantageous here. The novolaks can also be modified in a known manner by reacting some of their hydroxyl groups, for example with chloroacetic acid, isocyanates, epoxides or carboxylic anhydrides. Other alkali-soluble resins, such as copolymers of maleic anhydride and styrene, vinyl acetate and crotonic acid, methyl methacrylate and methacrylic acid and the like are also suitable as binders. Copolymers of (meth)acrylates containing free phenolic OH groups, and homopolymers or co-polymers of vinylphenols can also be used.

In addition, it is possible to use concomitantly numerous other resins, which may be either water-soluble or alternatively alkali-insoluble, for example polyvinyl acetates, polyurethanes, polyacrylates, polyvinyl ethers and polyvinyl pyrrolidones, which may themselves be modified by comonomers, and hydrogenated or partly hydrogenated colophonium derivatives. The most favorable proportion of these resins depends on the applicational requirements and on the effect on the development conditions and is generally not more than about 20 percent by weight of the alkali-soluble resin. For specific requirements, such as flexibility, adhesion, gloss etc., the photosensitive layer may additionally contain small amounts of further substances, such as polyglycols, cellulose ethers, for example ethylcellulose, wetting agents and finely disperse pigments.

Suitable radiation-sensitive components which form or eliminate strong acids on irradiation are a large number of known compounds and mixtures, such as diazonium, phosphonium, sulfonium and iodonium salts, halogen-containing compounds, o-quinonediazidesulfochlorides and organometallic/organohalogen combinations.

Suitable diazonium salts are the compounds known in the diazo process having a utilizable absorption between about 300 and 600 nm. Preferred compounds are those containing no basic substituents.

The onium salts mentioned are generally employed in the form of their salts which are soluble in organic solvents, mostly as deposition products with complex acids, such as tetrafluoroboric acid, hexafluorophosphoric acid, hexafluoroantimonic acid and hexafluoroarsenic acid.

In principle, all organohalogen compounds which are also known as free-radical photochemical initiators can be used as halogen-containing, radiation-sensitive compounds which form hydrohalic acid, for example those having more than one halogen atom on a carbon atom or on an aromatic ring. Examples are described in U.S. Pat. No. 3,515,552 and 3,779,778, DE-C 26 10 842 (corresponding to U.S. Pat. No. 4,101,323) and DE-C 27 18 259 (corresponding to U.S. Pat. No. 4,189,323).

The amount of acid donor can likewise vary considerably depending on its chemical nature and on the composition of the mixture. Favorable results are obtained using about 0.1 to 10 percent by weight, relative to the total solids, and 0.2 to 5 percent are preferred. Particularly for copying layers of thicknesses greater than 10 $\mu$m, it is advisable to use relatively little acid donor.

Soluble or finely divided, dispersible dyes and also, depending on the purpose of application, UV absorbers can be added to the photosensitive composition. Dyes which have proven particularly successful are the triphenylmethane dyes, in particular in the form of their carbinol bases. The polymethine dyes described in EP-A No. 224 161 are preferred for increasing the image contrast after exposure.

Suitable solvents for the radiation-sensitive composition according to the invention are ketones, such as methyl ethyl ketone; chlorinated hydrocarbons, such as trichloroethylene and 1,1,1-trichloroethane, alcohols, such as n-propanol, ethers, such as tetrahydrofuran, alcohol ethers, such as propylene glycol monoethyl ether, and esters, such as butyl acetate or 1-ethoxy-2-propyl acetate. It is also possible to use mixtures which may additionally contain, for specific purposes, solvents, such as acetonitrile, dioxane or dimethylformamide. In principle, all solvents which do not react irreversibly with the components can be used.

The choice of solvent should be matched to the coating method proposed, the layer thickness and the drying apparatus. For experimental amounts, thin layers of up to about 5 $\mu$m are preferably applied by spin coating. Using solutions having a solids content of up to about 40%, layer thicknesses of more than 60 $\mu$m can thus be achieved with a single application or by using a doctor blade. Dip coating is preferred for double-sided coating, it being possible to achieve rapid drying by using low-boiling solvents. Web coating is carried out by roller coating, coating by means of slot dies or spraying; individual plates can be coated using a curtain coater.

Preferred supports for layers of thicknesses greater than 10 $\mu$m are plastic films, which then serve as temporary supports for transfer layers. For these and for color-proofing films, polyester films are preferred. In most cases, metals are used as the supports for layer thicknesses of less than about 10 $\mu$m. The following can be employed for offset printing plates: mechanically or electrochemically grained and optionally anodized aluminum, which may in addition be chemically pretreated, for example with polyvinylphosphonic acid, silicates or phosphates, in addition multimetal plates having Cu/Cr or brass/Cr as the uppermost layer. The layers according to the invention are suitable for gravure or screen printing forms due to their good adhesion and etch resistance on copper or nickel surfaces. The compositions according to the invention can also be used as photoresists, for which they are particularly suitable due to their good shelf-life in solution.

Coating can be carried out directly or by dry layer transfer laminating from the temporary support onto circuit board materials comprising insulating boards copper-clad on one or both sides, onto glass or ceramic materials which may have been pre-treated with an adhesion promoter, and onto disks made of silicon, silicon oxide or silicon nitride.

For drying after coating, the customary equipment and conditions can be employed. Temperatures of around 100 C and, for a short time, up to 120° C. may be withstood without loss of radiation sensitivity.

For imagewise exposure, customary light sources, such as fluorescent tubes, pulsed xenon lamps, high-pressure mercury vapor lamps doped with metal halide, and carbon arc lamps can be used. Exposure can also take place using the coherent light of a laser. For the purposes of the present invention, short-wave lasers of appropriate power, for example argon lasers, krypton ion lasers, dye lasers and helium/cadmium lasers, which emit between about 300 and 600 nm are suitable. The laser beam is monitored by means of a linewise scanning movement.

A further way of producing an image is irradiation using electron beams. Electron beams are able to thoroughly decompose and crosslink the composition according to the invention, as well as many other organic materials, so that a negative image is produced when the unexposed areas are removed by solvent or by exposure without original and development. If the intensity of the electron beam is lower and/or the writing speed is higher, the electron beam, in contrast, causes differentiation towards higher solubility, i.e., the exposed areas of the layer can be removed by the developer.

The layer which has been exposed or irradiated imagewise can be treated using the same developers as for known layers based on acid-cleavable compounds, or the copying conditions for the novel layers can advantageously be matched to the known auxiliaries, such as developers and programmed spray-developing equipment. The aqueous developer solutions may contain, for example, phosphates, silicates or hydroxides of alkali metals and furthermore wetting agents and relatively small amounts of organic solvents. In certain cases, solvent/water mixtures can also be used as developers. The choice of the most favorable developer can be determined by trials using the layer employed in each case. If necessary, development can be mechanically assisted.

In order to increase the durability during printing and the resistance to washout agents, deletion fluids and UV-hardenable printing inks, the developed plates can be heated briefly to elevated temperatures, as is known from GB-A No. 1,154,749 for diazo layers. Image reversal by the method of EP-A No. 0 082 463 (corresponding to U.S. Pat. No. 4,506,006) is also possible.

The following examples are intended to further illustrate the invention.

EXAMPLE 1

The dimethylmalonaldehyde tetraethylacetal prepared according to J. org. Chem. 25; 258 (1960) was heated with four times the molar quantity of phenoxyethanol using toluene sulfonic acid as a catalyst and the ethanol produced was removed by distillation through a column. The residue and the distillate which had passed over up to Kp 77° C. corresponded to a yield of 74%. After neutralizing by stirring with anhydrous sodium carbonate and filtering, fractional distillation was continued in vacuo until no more distillate was recovered at 1.3 torr and about 80° C. The residue ($n_D=1.5493$) was a light yellow oil which was used in the following coating solution, the constituent amounts, relative to total solids, being varied in increments of 5%, from 20 to 40%. The stock solution to which the substance under test was added in the indicated amounts was composed of:

52 pbw of 1-methoxypropan-2-ol as a solvent,
  35 pbw of a cresol-formaldehyde novolak having a softening range from 105° to 120° C., according to DIN 53 181,
  3.1 pbW of a polyethylacrylate homopolymer (Plexisol B 574, manufacturer Roehm),
  0.25 pbw of 2-(4-styrylphenyl)-4,6-bis-trichloromethyl-s-triazine,and
  0.15 pbw of Crystal Violet Base (C.I. 42 555:1).

An addition of 9.5 pbw of the above-described substance corresponds to 20% solids. The viscosity of this coating solution is about 220 mPa·s. The solutions were used for the fabrication of fine-line circuit boards by roller coating, for example, using a commercial roll coater, Type AKL 400 for double-sided coating, manufacturer Buerkle, equipped with grooved rubber rolls having 48 to 64 grooves per 2.5 cm (linear). Depending on the solution, the grooved roll and the machine setting dry layer thicknesses of about 3 to 14 μm can be obtained by means of single coating.

After drying, the coated board is exposed first under a negative original which is transparent in the hole areas, these areas are then washed out using a 1.5% sodium hydroxide solution. The board is dried for 10 minutes at 80° C., then electroplated with copper at the bared hole areas and tin-plated. The photoresist layer is then exposed under a positive conductor track original and developed as above. The bared copper is removed by etching with an alkaline etchant.

For a 6 μm thick layer, clean development took 4 minutes at an acetal content of 25% and 1 minute at an acetal content of 35%; the overdevelopment resistance was more than 15 minutes. The layer containing 20% of acetal appears relatively hard to brittle, whereas the layer containing 40% of acetal makes a softer, flexible impression and is better suitable for flexible base materials, for example, for use in inner layers.

Similar results are obtained when a mixed acetal comprising isobutylene ethylether and methyl orthoformate is used. Elimination of either methanol or ethanol made no difference to the end product of transacetalization with phenoxyethanol.

EXAMPLE 2

To produce an offset printing plate, wire-brushed aluminum is coated with a coating solution comprising:
  6.9 pbw of the novolak of Example 1,
  2.7 pbw of the tetraacetal ($n_D=1.421$) obtained from ethyl glycol (ethoxyethanol) and methylethylmalonaldehyde tetramethyl acetal ($n_D=1.4255$). This product has been prepared from 2-methylbutyraldehyde ($n_D=1.3982$) via the intermediate stage of 2-methylbutenyl methylether ($n_D=1.411$),
  0.3 pbw of 2-(4,7-dimethoxy-naphth-1-yl)-4,6-bis-trichloromethyl-s-triazine and
  0.1 pbw of 4-dimethylaminoazobenzene in
  90.0 pbw of 1-methoxy-2-propyl acetate.

The solution is subsequently dried to form a homogeneous layer having a layer weight of 2.2 g/m², corresponding to a thickness of about 2 μm.

After drying, the coated plate is exposed under a positive original, developed using a 3.5% strength aqueous solution of trisodium phosphate which has been adjusted to a pH of 12.6 by addition of sodium hydroxide, then rinsed with water and finally prepared for printing by wiping over with 1% strength phosphoric acid. This plate exhibits rapid acceptance of the printing ink and sharp image reproduction.

For comparison, layers which contain the tetramethylacetal and/or the above-indicated enol ether (2-methylbutenyl methylether) instead of the acetal used are prepared and processed in an analogous manner.

This 2-methylbutenyl methylether which is, in its IR spectrum, characterized by the enol ether-vinyl proton band at 1670 cm$^{-1}$, does not produce an image of the original, even after treatment in the developer for 30 minutes. The tetramethylacetal prepared therefrom, which no longer contains the above-indicated band, requires three minutes for clean development, if it is developed shortly after exposure. If development is carried out two hours after exposure a clear image appears only after developing for 10 minutes. This is explained by the fact that, meanwhile, the major portion of the methanol formed in the exposed areas by acetal cleavage has evaporated from the layer. The acetal used in this example, on the other hand, which contains ethylglycol as the alcohol component produces a good differentiation after developing for 1 minute. Similar results are achieved when the product produced analogously by transacetalization with butylglycol (n-butoxyethanol) is used; clean development is then obtained in approximately 20 minutes, which means that it is somewhat slower.

EXAMPLE 3

A glass plate with a conductive transparent ITO (indium tin oxide) coating applied by sputtering for the production of liquid crystal display elements (LCD) is coated by spin-coating with a light-sensitive layer of the following composition:
  60 pbw of a copolymer of 4-hydroxystyrene and hexyl methacrylate (OH number 290, RSV value 0.55 dl/g in dimethylformamide), 19 pbw of the tetraacetal obtained from ethoxyethanol and the diethylmalonaldehyde methyl acetal prepared from 2-ethylbutyraldehyde,
0.5 pbw of 2-acenaphth-5-yl-4,6-bis-trichloromethyl-s-triazine,
0.25 pbw of Solvent Blue 5 (C.I. 61 554),
0.25 pbw of Crystal Violet Base, and
120 pbw of 1-methoxypropan-2-ol.

After drying, the layer is about 4 μm thick. After exposure under a positive original the layer is developed in 40 seconds using a 1% strength sodium hydroxide solution and is stripped with a 5% strength potassium hydroxide solution in the bared areas. Electrically conductive transparent plates are thus obtained, for example, for a 7-segment numerical display. The blue basic coloration serves to enhance the image contrast up to the etching procedure.

If the above substance is replaced by the tetraacetal from 2-ethylbutanol the development time increases to 70 seconds. The product ($n_D=1.423$) obtained with phenoxyethanol which is prepared in an analogous manner requires a development time of 50 seconds and shows an excellent overdevelopment resistance. Even if 40 pbw of this substance (instead of 19.5 pbw) are used, the relatively soft layer can be cleanly differentiated imagewise in 30 minutes.

EXAMPLE 4

Positive color-proofing films are prepared, e.g., for checking the mounting in multicolor offset printing. For this purpose, malonaldehyde acetals prepared with higher alkyl substituents and higher alcohols are used, which yield properly differentiatable, soft and transferable color layers. In the preparation process, removal of the non-reacted components in vacuo is sufficient, in each case, after the purifying distillation of the enol ethers and reaction with methyl orthoformate and transacetalization with the higher alcohol, since the dialkylmalonaldehyde tetraacetals which, under normal conditions, are hardly or even no longer capable of distillation can be used as they are, in the form of an oily residue.

For this example, the malonacetal obtained from 2-ethyl-hexanal and phenoxyethanol is examined more closely. In the process, the enol ether with $K_p$ 173° to 182° C. is additionally purified by distillation, the ethyl-butyl-malonaldehyde tetraacetals are not treated in this manner.

The copying layers have the following composition:
45 pbw of the above tetraacetal,
48 pbw of the novolak as in Example 1,
5 pbw of polyvinyl methylether (Lutanol M 40),
0.5 pbw of 2,5-diethoxy-4-p-tolylmercaptobenzenediazonium hexafluorophosphate,
2.5 pbw of Zapon Fast Blue HFL (C.I. 2880) or
1.2 pbw of Zapon Fast Red BB (C.I. 2864) or
2.0 pbw of Fat Yellow 5 G (C.I. Suppl. 572).

The layer thicknesses between 1 and 3 μm on a 50 μm thick polyester film and the amounts of dye are matched to one another so that the red, blue and yellow films have the same light-sensitivity, i.e. produce equally long wedge steps for a continuous-tone test wedge copied beside the original, at both the same exposure time and the same development time using an 0.5% strength sodium hydroxide solution. These scratchproof color-proofing films are more than twice as light-sensitive as comparison products based on o-naphthoquinone diazides. In addition, these color layers can be transferred from the film onto paper under pressure and heat, because they are relatively soft and adherent. If the alcohol component used for transacetalization comprises methoxyethoxyethanol (Kp 180°–196° C.) instead of phenoxyethanol, similar results are obtained after development using an 0.4% strength sodium hydroxide solution, as the developer.

What is claimed is:

1. A positive-working radiation-sensitive composition comprising:
   (a) a binder which is insoluble in water and soluble or swellable in organic solvents and in aqueous-alkaline solutions,
   (b) a compound which forms a strong acid upon irradiation, and
   (c) an acetal compound of the general formula

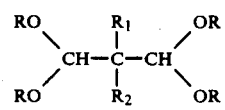

wherein
   R denotes an alkyl group which may be substituted, and
   $R_1$ and $R_2$ are identical or different and denote alkyl groups containing 1 to 6 carbon atoms.

2. A composition as claimed in claim 1, wherein
   R denotes an alkyl group substituted by alkoxyl, aryl, aryloxyl or polyalkoxyl and containing a total of 2 to 20 carbon atoms and
   $R_1$ and $R_2$ are identical or different and denote alkyl groups containing 1 to 4 carbon atoms.

3. A composition as claimed in claim 2, wherein R contains 2 to 10 carbon atoms.

4. A composition as claimed in claim 1, wherein $R_1$ and $R_2$ denote identical or different alkyl groups containing 1 to 4 carbon atoms.

5. A composition as claimed in claim 1, which contains about 25 to 60 percent by weight of said acetal, relative to total solids.

6. A composition as claimed in claim 1, which contains about 30 to 80 percent by weight of said water-insoluble binder, relative to total solids.

7. A composition as claimed in claim 1, which contains about 0.1 to 10 percent by weight, relative to total solids, of said compound which forms a strong acid under the action of actinic radiation.

8. A radiation-sensitive recording material comprising a support and a radiation-sensitive recording layer comprising a composition as claimed in claim 1.

9. A process for the production of relief images, comprising the steps of irradiating imagewise a radiation-sensitive recording material as claimed in claim 8, with actinic radiation in a dose such that the solubility of the layer in a liquid developer increases, and washing out the irradiated layer areas using an aqueous-alkaline developer.

10. Composition as claimed in claim 1, consisting essentially of the recited ingredients.

11. A radiation-sensitive recording material as claimed in claim 8, consisting essentially of the recited ingredients.

* * * * *